United States Patent [19]

Rein

[11] 4,184,539
[45] Jan. 22, 1980

[54] ELECTRONIC CARD MOUNT AND HEAT TRANSFER ASSEMBLY FOR UNDERWATER VEHICLES

[75] Inventor: Charles R. Rein, Panama City, Fla.

[73] Assignee: The United States of America as represented by the Secretary of the Navy, Washington, D.C.

[21] Appl. No.: 923,138

[22] Filed: Jul. 10, 1978

[51] Int. Cl.² .................. F28F 13/00; H01L 23/34
[52] U.S. Cl. ............................ 165/80 B; 165/185; 361/386
[58] Field of Search ............. 165/80 B, 80 R, 185, 165/80 C; 361/386; 114/312

[56] References Cited

U.S. PATENT DOCUMENTS

| | | | |
|---|---|---|---|
| 3,364,395 | 1/1968 | Donofrio et al. | 361/386 |
| 3,364,987 | 1/1968 | Bylund et al. | 165/80 B |
| 3,550,681 | 12/1970 | Stier et al. | 165/80 B |
| 3,654,521 | 4/1972 | LaSelle | 361/386 |
| 3,722,579 | 3/1973 | Hitchcock et al. | 165/185 |
| 3,776,305 | 12/1973 | Simmons | 165/80 C |
| 3,820,592 | 6/1974 | Lander | 165/80 B |
| 3,833,836 | 9/1974 | Moksu et al. | 361/386 |
| 3,865,183 | 2/1975 | Roush | 165/80 C |
| 3,921,201 | 11/1975 | Eisele et al. | 165/80 C |

Primary Examiner—Sheldon Richter
Attorney, Agent, or Firm—Richard S. Sciascia; Harvey A. David

[57] ABSTRACT

A plurality of electronic circuit cards are edge mounted in heat transfer relation to a pair of spaced parallel card mounting plates extending from a bulkhead of an underwater instrumentation vehicle hull having a tubular cover section adapted to be moved into and out of covering relation to the cards and mounting plates. Spring biased slip plates provide heat transfer paths from the mounting plates to the cover section for dissipation to ambient water.

7 Claims, 4 Drawing Figures

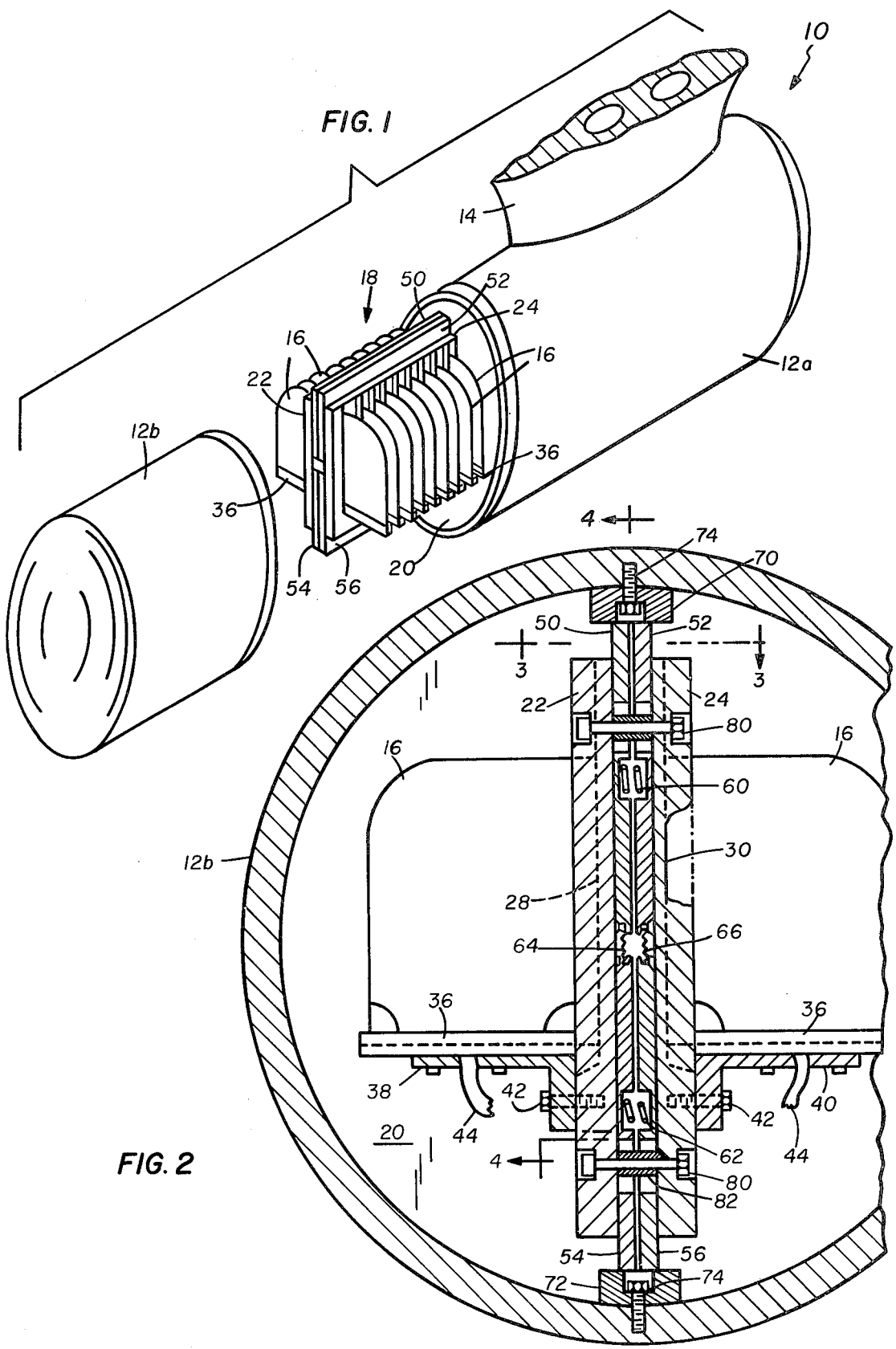

ELECTRONIC CARD MOUNT AND HEAT TRANSFER ASSEMBLY FOR UNDERWATER VEHICLES

BACKGROUND OF THE INVENTION

This invention relates generally to mounting devices for electronic circuit boards or cards, and more particularly to an improved card mount and thermal transfer assembly.

Because of the density of electronic circuitry and the amount of electrical power handled on some electronic circuit cards, a considerable amount of heat is generated that must be carried away from the card to prevent thermal damage to electronic components. In some well ventilated applications this can be accomplished by simple convection air currents. In some, the addition of blowers can be used to augment the natural air flow.

Other applications that require less readily ventilated packaging of circuit cards, such as in an aircraft or spacecraft, have used mechanical refrigeration systems, one example of which is provided by U.S. Pat. No. 3,776,305 to C. E. Simmons.

The removal of heat from electronic circuit cards by thermal transfer to heat sink means such as a mounting frame has been utilized in the apparatus disclosed in U.S. Pat. No. 3,550,681 to P. G. Stier, et al. In that apparatus a T-shaped bar is adapted to be held in heat transfer contact with a frame by frame mounted spring clips and has a lost motion connection with one edge of a circuit card that permits heat transfer from the card and limited positioning thereof for effecting mating with a connector.

While the foregoing expedients have been satisfactory for some applications they are not suitable for certain other special situations, particularly in the case of mounting of electronic circuit cards in small, high powered underwater devices such as towed sonar instruments or apparatus. Those apparatus are necessarily characterized by severe space, weight, and power limitations in that the size and weight of the vehicle are important factors in determining the speeds and depths of tow, and also whether the apparatus can be easily handled and steamed from a tow craft. In addition, the use of refrigeration systems, coolant circulating pumps, and the like, are prone to produce acoustic and electronic signatures that are detrimental to the operation of sonar systems. Another factor is that of accessibility of the cards for inspection or replacement, in view of the usually tubular configuration of the apparatus hull or housing, a portion of which must be removed for access to the cards.

SUMMARY OF THE INVENTION

With the foregoing in mind, it is a principal object of this invention to provide an improved circuit card mounting and thermal transfer device.

Another object is the provision of a novel electronic circuit card mounting and heat removal device particularly suited to use in an underwater vehicle having a generally tubular hull or housing.

Still another object is the provision, in an underwater instrument, of an electronic card mounting and thermal transfer device of the foregoing character that provides more complete and effective transfer of excess heat from a plurality of cards to an adjacent wall, and which provides for ease in access to the cards for inspection or servicing without disturbing the mounting of the cards unless actual removal or replacement is required.

Yet another object is the provision of a card mount that effects the conduction of heat to the pressure hull of an underwater vehicle via a flow path having a relatively direct route and ample cross-sectional area.

As another object the invention aims to provide, in an underwater vehicle having a pressure hull, a circuit card supporting structure that provides automatic coupling and uncoupling of a thermal flow path to a tubular pressure hull section upon assembly and disassembly of that hull section relative to the remainder of the pressure hull.

Other objects and many of the attendant advantages will be readily appreciated as the subject invention becomes better understood by reference to the following detailed description, when considered in conjunction with the accompanying drawings.

DESCRIPTION OF THE DRAWINGS

FIG. 1 is a perspective view of an underwater sonar apparatus including an electronic card mounting and thermal transfer device embodying the invention, a cover portion of the pressure hull being separated from the apparatus to reveal electronic cards and their support means;

FIG. 2 is an enlarged transverse sectional view of the apparatus of FIG. 1 with the cover portion in place;

DESCRIPTION OF THE PREFERRED EMBODIMENT

Figure 3:
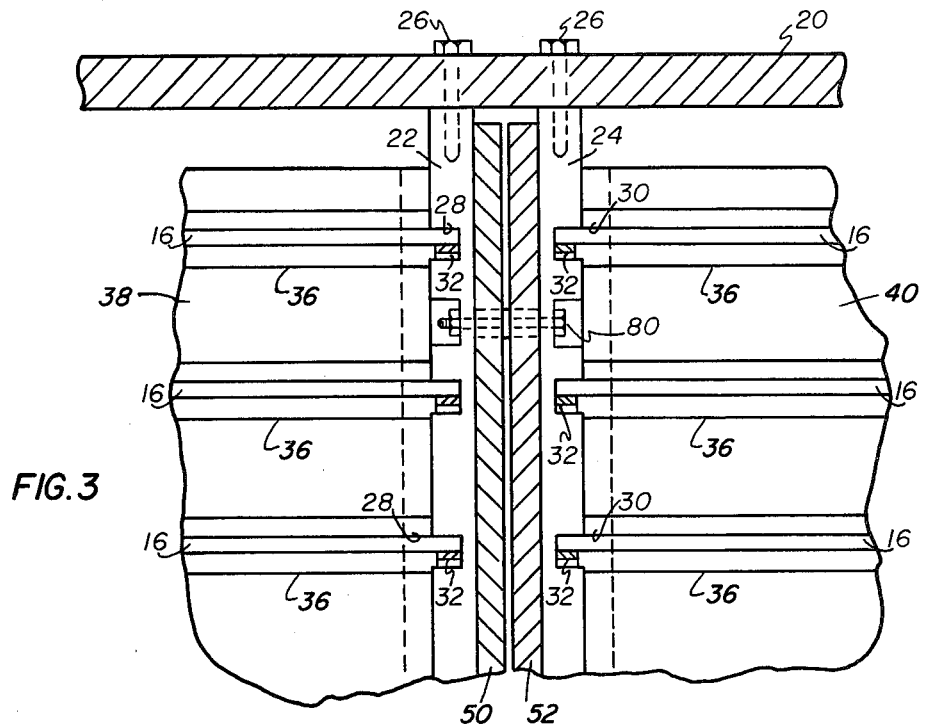
FIG. 3 is a fragmentary sectional view taken substantially along line 3—3 of FIG. 2.
Figure 4:
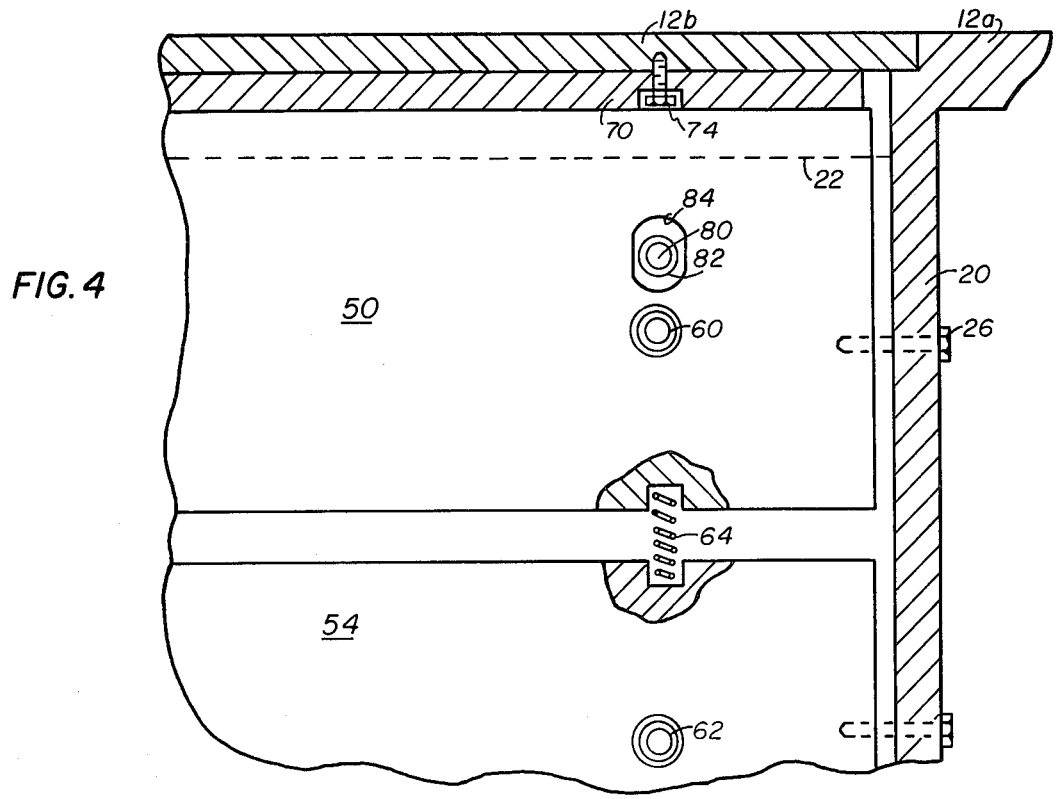
FIG. 4 is a fragmentary sectional view taken substantially along line 4—4 of FIG. 2.

The exemplary preferred embodiment of the invention is illustrated and described as used in a sonar system wherein an instrumentation vehicle is towed underwater from a towing craft. Referring first to FIG. 1, a portion of the sonar instrumentation vehicle is indicated generally at 10 and comprises a tubular pressure hull having a main hull section 12a and a separable cover section 12b. These hull sections are preferably formed of a rigid, corrosion resisting material such as marine aluminum, and at least the cover section 12b must have good thermal conductivity. The main hull section 12a is supported by a pylon or strut 14 from a stabilizer section (not shown) and houses components such as transducers that are not part of the invention per se but are served by a plurality of electronic circuit cards 16 carried in a card mount and heat transfer assembly, generally indicated at 18 and mounted on a bulkhead 20 so as to cooperate with and be housed by the pressure hull cover section 12b, when in place. Referring additionally now to FIGS. 2-4, the assembly 18 comprises a pair of rectangular, laterally spaced, parallel, card mounting plates 22, 24 that are edge mounted on the bulkhead 20 as by screws 26. These plates are formed of aluminum or other rigid material having good thermal conductivity. The outer surfaces of the plates 22, 24 are provided with a plurality of parallel, electronic card edge receiving grooves 28, 30, respectively. The cards 16, which are of the type comprising a layer of cladding of a thermally conductive metal such as copper or aluminum, each have one edge disposed in a respective groove 28, 30 and clamped securely therein against the wall of the groove as by a suitable clamp 32. The clamps 32 may conveniently be any of several commercially available types such as can be actuated to clamp or release the circuit cards, for example by a wedging action. The particular clamp construction is not important to the invention so long as it secures the edge portions of the cards 16 in good heat transferring relation to the card mounting plates 22, 24.

The lower ends of the cards 16 are adapted to be received in electrical terminal connectors or sockets 36 mounted on angular brackets 38, 40 that are secured to the outer faces of the plates 22, 24, respectively, by screws 42. Suitable wire conductor leads 44 extend to each of the sockets 36.

During operation of the sonar, the circuit cards 16 tend to generate heat that is transferred to the mounting plates 22, 24 and must continually be carried away in order to prevent damaging temperature build-up in the circuit cards and damage to the electronic components thereon. The present invention provides for substantially direct, large cross-sectional flow paths for conduction of thermal energy from the plates 22, 24, through the wall of hull cover section 12b to the relatively cool ambient water medium in which the vehicle 10 operates, while still permitting ease of removal of the hull cover section for inspection and removal of the cards 16. To this end, a plurality of thermally conductive slip plates 50, 52, 54, and 56 are provided in the space between the card mounting plates 22, 24. These slip plates have the major areas of their outwardly facing surfaces held in contact with the inwardly facting surfaces of the card mounting plates 22, 24. This is accomplished by compression springs 60 disposed in facing cavities in the slip plates 50, 52 and compression springs 62 disposed in facing cavities in the slip plates 54, 56. The springs 60, 62 serve to resiliently bias the slip plates outwardly into the mentioned contact with the plates 22, 24 while permitting limited sliding movement of the slip plates for a reason which will become apparent as this specification procedes.

The slip plates 50 and 54, which are in an edge-to-edge relation in a common plane, are biased outwardly away from one another by compression springs 64, while the slip plates 52 and 56, in a similar relation, are biased outwardly away from one another by springs 66.

The inner surface of the tubular housing cover section 12b is provided with thermally conductive slip plate seat members 70, 72 that are conveniently secured as by screws 74. When the cover section 12b is in place as shown in FIGS. 2 and 4, the upper edge surfaces of the slip plates 50 and 52 are resiliently biased by springs 64, 66 into thermally conductive contact with the seat member 70. Similarly, the lower edge surfaces of the slip plates 54 and 56 are resiliently biased into thermally conductive contact with the seat member 72. Such contact of the slip plates 50, 52, 54 and 56 with the seat members 70, 72 complete heat flow paths from the cards 16 through the mounting plates 22, 24, the slip plates, the seat members, and the wall of the hull section 12b to the ambient water medium.

The card mounting plates 22, 24 are provided with through bolts 80 to prevent spreading of those plates under the influence of the springs 60, 62. The bolts are provided with spacers 82 to further assure that the plates 22, 24 are held in a parallel relation. The slip plates 50, 52, 54, and 56 are provided with enlarged openings 84, through which the bolts 80 and spacers 82 extend, and are thereby permitted only the limited movement mentioned earlier.

It will be appreciated that the hull cover section 12b can be easily removed from its covering relation to the cards 16 and the assembly 18, to reveal the cards and their electrical components and connections, without disturbing the cards or their mountings. It will also be appreciated that when the cover section 12b is replaced, that the seat members 70, 72 will slide smoothly over the edges of the slip plates and re-establish the heat flow paths without requiring any further connections or operations. The inwardly facing surfaces of the seat members 70, 72 are advantageously curved concentrically with the hull section, and the outer edge surfaces of the slip plates 50, 52, 54, and 56 are provided with a complementary curvature, thereby assuring good thermal contact even though small angular misalignments occur between the various parts.

It will be understood that a variety of mechanical equivalents may be resorted to. For example, the seat members 70, 72 may be made integral with the hull section wall, or may be omitted entirely, allowing the slip plates to contact the hull section wall directly. Also, other forms of springs may be used; for example leaf springs can replace the springs 60, 62, and 64.

Obviously, other embodiments and modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included within the scope of the appended claims.

What is claimed is:

1. An electronic card mount and heat transfer assembly in combination with a housing having opposing, spaced, wall portions, said assembly comprising:
   a pair of heat conductive card mounting plates fixed together in congruent, spaced, parallel relation to one another;
   first and second pairs of heat conductive slip plates disposed between said card mounting plates;
   first spring means acting between the slip plates of each of said first and second pairs thereof so as to resiliently bias the slip plates of each pair into heat transfer contact with opposed surfaces of said card mounting plates; and
   second spring means acting between one of each of said first and second pairs of slip plates so as to resiliently bias said first and second pairs of slip plates into heat transfer contact with said opposing, spaced wall portions;
   whereby heat flow paths are established from electronic circuit cards when mounted on said card mounting plates, through said mounting plates, said slip plates, and said wall portions to an ambient medium.

2. An electronic card mount and heat transfer assembly as defined in claim 1, and wherein:
   said opposing spaced wall portions comprise first and second heat conductive seat means; and
   said first and second pairs of slip plates slidably engage said first and second seat means whereby said housing wall portions are slidably movable relative to said assembly without disturbing the mounting of said cards.

3. An electronic card mount and heat transfer assembly as defined in claim 2, and further comprising:

means for interconnecting said card mounting plates and for limiting movement of said slip plates relative thereto.

4. In combination with an underwater instrumentation vehicle comprising an elongated hull including a bulkhead and a tubular cover section, an electronic card mount and heat transfer device comprising:
- a pair of congruent, rectangular, spaced, parallel card mounting plates presenting outwardly and inwardly facing surfaces, said card mounting plates each having one edge fixed to said bulkhead and each extending at right angles therefrom;
- clamping means, on outwardly facing surfaces, for releasably securing a plurality of electronic cards in heat transfer relation to each of said mounting plates;
- first and second pairs of parallel, substantially congruent, rectangular slip plates disposed between said inwardly facing surfaces of said card mounting plates, one of the slip plates of said first pair lying in a first substantially common plane with one of the slip plates of said second pair and the other of the slip plates of said first pair lying in a second substantially common plane with the other slip plate of said second pair;
- means extending through said card mounting plates and said slip plates for limiting movement of the latter relative to the former;
- first spring means, disposed between the slip plates of said first pair and between the slip plates of said second pairs, for resiliently urging said slip plates into heat transferring contact with said card mounting plates;
- second spring means, disposed between said one slip plate of each of said pairs and between said other slip plates of each of said pairs, for urging said slip plates individually into heat transferring contact with said tubular cover section.

5. The combination defined in claim 4, and wherein:
- said tubular cover section is axially movable toward and away from said bulkhead into and out of covering relation to said card mounting plates and cards thereon;
- said cover section comprising first and second axially extending heat transfer seat means at antipodal locations on the inner surface thereof; and
- said first and second pairs of slip plates having edge portions exposed beyond said mounting plates and adapted to slidably bear against said first and second seat means respectively.

6. The combination defined in claim 5, and wherein:
- said card mounting plates each are characterized by a plurality of parallel grooves in said outwardly facing surfaces in which edges of said cards are adapted to be received and secured in heat transfer contact with groove wall portions of said mounting plates by said clamping means.

7. The combination defined in claim 6, and wherein:
- said clamping means comprises a wedging mechanism.

* * * * *